United States Patent [19]

Weggel

[11] Patent Number: 5,723,913
[45] Date of Patent: Mar. 3, 1998

[54] HIGH-VOLTAGE ELECTRONIC SWITCHING CIRCUIT

[75] Inventor: Craig R. Weggel, Willow Grove, Pa.

[73] Assignee: Performance Controls, Inc., Horsham, Pa.

[21] Appl. No.: 350,411

[22] Filed: Dec. 6, 1994

[51] Int. Cl.[6] .................................. H01H 47/00
[52] U.S. Cl. ..................... 307/113; 307/125; 363/132
[58] Field of Search ............................ 307/112, 113, 307/125, 116, 17, 83, 98, 99; 363/132, 136, 67, 60, 124, 135; 327/460, 470, 471

[56] References Cited

U.S. PATENT DOCUMENTS

| | | | |
|---|---|---|---|
| 3,495,149 | 2/1970 | Swain | 318/138 |
| 4,347,558 | 8/1982 | Kalinsky | 363/17 |
| 4,414,599 | 11/1983 | Kobayashi | 361/56 |
| 4,424,557 | 1/1984 | Steigerwald | 363/98 |
| 4,517,472 | 5/1985 | Ruitberg et al. | 307/82 |
| 4,594,650 | 6/1986 | Kinbara | 363/58 |
| 4,631,653 | 12/1986 | Small | 363/17 |
| 4,675,800 | 6/1987 | Seki et al. | 363/68 |
| 4,875,150 | 10/1989 | Matthes | 363/51 |
| 4,979,089 | 12/1990 | Takase et al. | 363/132 |
| 5,010,470 | 4/1991 | Lipman et al. | 363/132 |
| 5,065,301 | 11/1991 | Shioya et al. | 363/17 |
| 5,111,376 | 5/1992 | Mehl | 363/71 |
| 5,159,515 | 10/1992 | Fishbein | 361/18 |
| 5,164,890 | 11/1992 | Nakagawa et al. | 363/65 |
| 5,191,519 | 3/1993 | Kawakami | 363/71 |
| 5,227,961 | 7/1993 | Claydon et al. | 363/17 |
| 5,253,155 | 10/1993 | Yamamoto | 363/71 |
| 5,253,157 | 10/1993 | Severinsky | 363/98 |
| 5,315,498 | 5/1994 | Berrios et al. | 363/98 |
| 5,422,765 | 6/1995 | Kobayashi et al. | 363/40 |

OTHER PUBLICATIONS

F. W. Gutzwiller, "Silicon Controlled Rectifier Manual", General Electric, pp. 98–103, Jul. 1965.

*Primary Examiner*—William M. Shoop, Jr.
*Assistant Examiner*—Jonathan S. Kaplan
*Attorney, Agent, or Firm*—William H. Eilberg

[57] ABSTRACT

A high-voltage switching circuit is formed of a series combination of switches, each of which is rated for use at a voltage lower than that of the power supply. The switches are connected in series with inductors, the inductors being magnetically coupled, in an anti-phase manner. A pair of capacitors, having substantially equal values of capacitance, are connected, respectively, in parallel with each series combination of a switch and inductor. The inductors and capacitors together insure that no more than one-half the total voltage of the power supply will ever appear across either switch. The series combination of switches can be used in place of a single switch, and permits the use of switches rated at low voltage to be combined to form an overall switch which works reliably at a higher voltage.

6 Claims, 1 Drawing Sheet

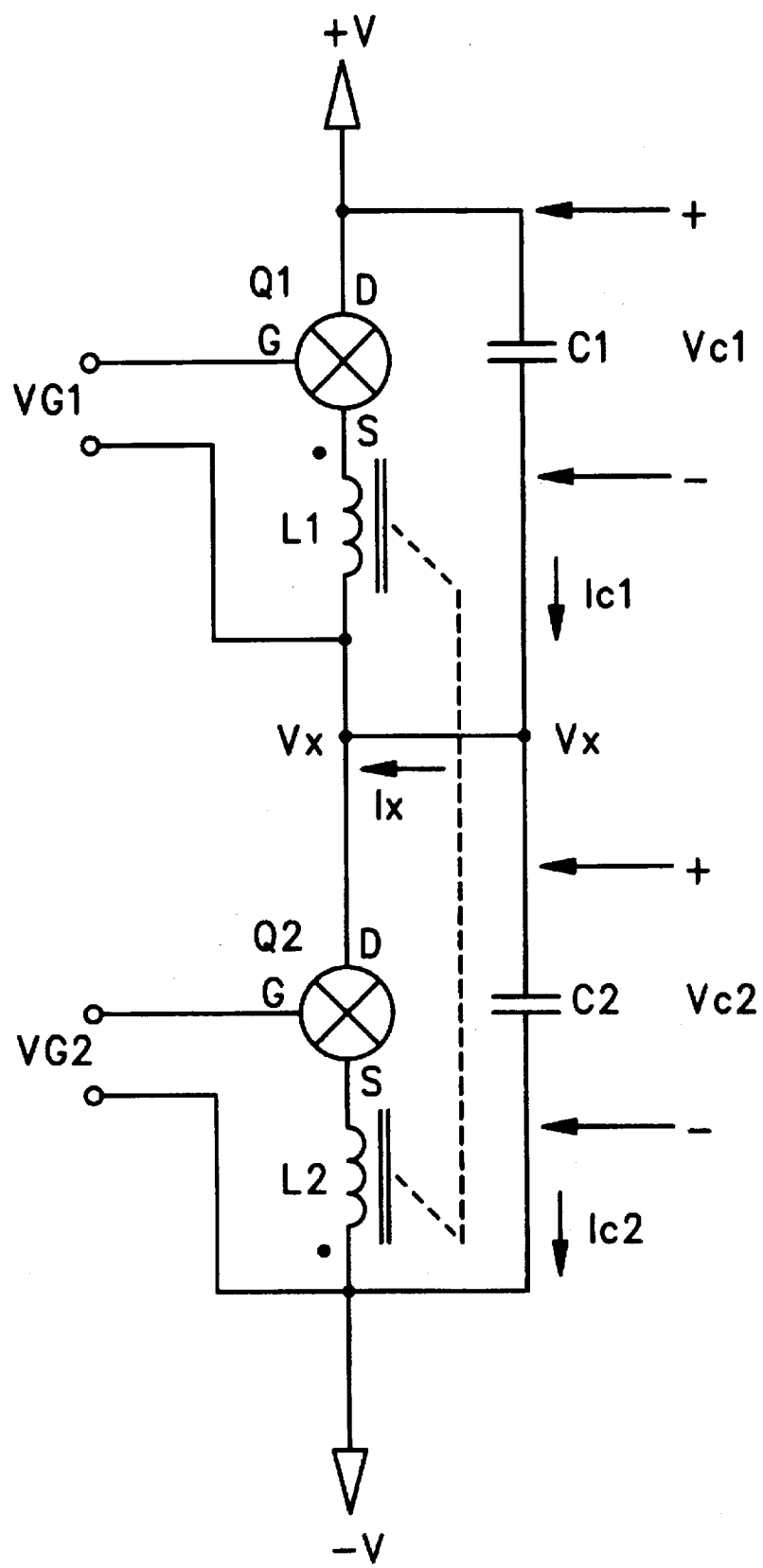

HIGH-VOLTAGE ELECTRONIC SWITCHING CIRCUIT

BACKGROUND OF THE INVENTION

This invention relates to the field of electronic switching devices, and provides a switching circuit capable of operation at voltages higher than the rated voltage of the switches comprising the circuit.

Every transistor or other electronic switch has a maximum rated voltage, above which the switch may not safely be used. One way of over-coming the voltage limitation of an electronic switch is to form a switching circuit having two or more switches connected in series. The aim is to apply a high voltage across the series combination, while preventing the voltage applied across either switch from exceeding the rated voltage of the switch. In effect, a plurality of low-voltage switches combine to form a single high-voltage switch.

Ideally, the voltage of the power supply will divide evenly across the two switches connected in series, so that neither switch ever "sees" the full power supply voltage. However, in practice, this ideal situation is not attainable. Even if the switches are manufactured as identical units, the two switches will never be exactly alike. Moreover, supposedly identical signals applied to the switches may not be exactly identical. Thus, when supposedly identical control signals are applied to the gates of two supposedly identical switches, one switch will, in general, respond slightly earlier than the other. For example, if the switches are both being turned "on", then one switch will usually turn on first, and the other will follow. When one switch is conducting and the other switch is non-conducting, the full voltage of the power supply will momentarily appear across the non-conducting switch. The switch may thus be destroyed, or its useful life curtailed, due to excessive operation at higher than rated voltage.

The present invention provides a switching circuit which solves the problem described above. The present invention provides a switching circuit having two switches connected in series, but wherein each constituent switch is never exposed to more than one-half the maximum voltage of the power supply.

SUMMARY OF THE INVENTION

The switching circuit of the present invention includes two electronic switches, connected in series. The source of each switch is connected to an inductor, in such manner that the inductor forms part of the gate circuit. The inductors are magnetically coupled to each other, in an anti-phase manner, such that a positive change in voltage across one inductor induces a negative change in the other inductor, and vice versa. A pair of capacitors, having substantially identical values, are connected in parallel with the switches.

It can be shown that in the switching circuit described above, if the values of the capacitors are truly equal, the voltage across either switch is never more than one-half the maximum voltage of the power supply. Therefore, for a given voltage requirement, a switching circuit can be built which has constituent switches rated for substantially less than that voltage requirement.

The series combination of switches is equivalent to a single electronic switch, and can be used in any application which requires an electronic switch.

The present invention therefore has the primary object of providing an electronic switching circuit capable of operating at high voltages.

The invention has the further object of providing an electronic switching circuit having constituent switches which are rated at a lower voltage than the voltage to be applied to the overall switching circuit.

The invention has the further object of reducing the size of a voltage-dividing capacitor required in a high-voltage switching circuit.

The invention has the further object of providing a high-voltage switching circuit having a simple and economical construction.

The reader skilled in the art will recognize other objects and advantages of the invention, from a reading of the following brief description of the drawing, the detailed description of the invention, and the appended claims.

BRIEF DESCRIPTION OF THE DRAWING

The FIGURE provides a schematic diagram of the high-voltage switching circuit of the present invention.

DETAILED DESCRIPTION OF THE INVENTION

The preferred embodiment of the switching circuit of the present invention is shown in the FIGURE. The switching circuit includes constituent switches $Q_1$ and $Q_2$, connected in series, as shown. A power supply (not shown) is connected to the drain of $Q_1$ and the source of $Q_2$, through inductor $L_2$. The full voltage of the power supply is (V+)−(V−).

In this specification, the three connections to the switches are called "source", "gate", and "drain". These labels are used to enhance the clarity of the description. However, the invention is not limited to the case in which the switches are FETs or IGBTs; other types of electronic switches or transistors could be used instead. The source, gate, and drain are designated by the letters S, G, and D in the FIGURE.

Connected to the sources of both switches are inductors $L_1$ and $L_2$, as shown in the FIGURE. The inductors are magnetically coupled, and wound such that a change in voltage across one inductor induces a change in the other inductor of opposite sign. The signals applied to the gates, designated $V_{G1}$ and $V_{G2}$, are applied between the actual gate and the end of the inductor opposite the source terminal. Thus, the inductor forms part of the gate circuit for each switch. The latter fact insures that each inductor will use the gain of the switch to aid in forcing the switches to share current.

The magnetic orientation of the inductors is such as to avoid voltage "overshoot" in the switches. That is, due to the fact that the inductors "buck" each other, the circuit prevents an overvoltage from appearing across either switch.

Capacitor $C_1$ is connected in parallel with the series combination of switch $Q_1$ and inductor $L_1$, and capacitor $C_2$ is connected in parallel with the series combination of switch $Q_2$ and inductor $L_2$. Capacitors $C_1$ and $C_2$ have substantially identical values, and act as a voltage divider. The capacitors are preferably connected in parallel with the series combination of the switch and inductor, as shown.

The switches $Q_1$ and $Q_2$ should be viewed as part of a single switching unit. That is, the switching circuit shown in the FIGURE is intended to be substituted for a single switch in a larger circuit. For example, the switching circuit could be one switch in a pulse-width modulated (PWM) circuit for applying a voltage to a load, such as a motor, in which the PWM circuit comprises an H-bridge formed of four switches. In the latter case, each switch of the H-bridge could be replaced by the circuit shown in the FIGURE.

Note that since $Q_1$ and $Q_2$ are part of the same unit, the control signals applied to the gates of these switches are identical. In the example of the H-bridge PWM circuit, the same PWM signal would be applied to the gates of both $Q_1$ and $Q_2$. The unit which includes $Q_1$ and $Q_2$ inherently compensates for minor differences between the control signals.

The following analysis shows that the circuit of the present invention does indeed cause equal voltages to appear across the constituent switches of the circuit.

The inductors $L_1$ and $L_2$ force the currents in the switches to be equal:

$$I_{Q1} = I_{Q2}$$

The truth of the latter statement can be appreciated from the following physical explanation. Suppose that the signal applied to the gates is positive, and both switches are to be turned on. Suppose further that $Q_1$ turns on before $Q_2$. Then $I_{Q1}$ rises, while $I_{Q2}$ remains momentarily zero, and the change in current in $L_1$ generates a voltage of a polarity which tends to oppose the turning on of $Q_1$, and which tends to assist the turning on of $Q_2$. The result is that the magnetically coupled inductors tend to force equal currents to flow through $Q_1$ and $Q_2$.

Kirchhoff's current law requires that $$I_x = I_{Q1} + I_{Q2}$$

and when the magnitudes of $I_{Q1}$ and $I_{Q2}$ are equal, $I_x = 0$. Also, based on Kirchhoff's current law, $$I_x = I_{C1} + I_{C2}$$

When $I_x = 0$, the magnitudes of $I_{C1}$ and $I_{C2}$ are equal. Voltage $V_{C1}$ and $V_{C2}$ are defined as:

$$V_{C1} = Q_{C1}/C_1$$

$$V_{C2} = Q_{C2}/C_2$$

where Q is the charge on the respective capacitor. Since charge is directly proportional to current, then it follows that since the magnitudes of $I_{C1}$ and $I_{C2}$ are equal, $Q_{C1} = Q_{C2}$.

If $C_1 = C_2$, then $V_{C1} = V_{C2}$. The latter equation implies that $$V_{Qx} = \frac{1}{2}[V_{C1} + V_{C2}]$$

where $V_{Qx}$ is either $V_{Q1}$ or $V_{Q2}$. And since $$V_{C1} + V_{C2} = (V+) - (V-),$$

it follows that $$V_{Qx} = \frac{1}{2}[(V+) - (V-)].$$

Thus, the voltage across either of the switches is equal to half the maximum voltage of the power supply.

The switching circuit of the present invention has the advantage that the capacitors $C_1$ and $C_2$ can be much smaller than the capacitors that have been used as voltage dividers in the prior art. For example, one can use capacitors having values as small as 0.001 µF, instead of capacitors in the 0.1 µF range. Thus, one can reduce the size of such capacitors by about two orders of magnitude.

The values of $C_1$ and $C_2$ must be equal if one wants the voltage to divide equally between the two switches. The above derivation assumes that $C_1 = C_2$. If these values of capacitance are not equal, then more than one-half of the maximum power supply voltage can be expected to appear, transiently, across the switches. To the extent that the capacitors depart from the condition of equality, one must use switches having a voltage rating which is more than half the maximum voltage of the power supply. The more the capacitors approach the condition of equality, the more the switching circuit tends toward restricting the voltage across either switch to one-half the voltage of the power supply.

If one wants the voltage to divide by a predetermined unequal amount, between the two switches, one would assign different values to $C_1$ and $C_2$. The latter situation could be used where one wants to combine one switch having a given voltage rating with another switch having a different voltage rating.

The invention can be modified in various ways. For example, different types of switches could be used for $Q_1$ and $Q_2$. Also, on could build a switching unit containing more than two switches in series. These and other modifications, which will be apparent to those skilled in the art, should be considered within the spirit and scope of the following claims.

What is claimed is:

1. A high-voltage switching circuit comprising a pair of electronic switches, each of said switches having a source, a gate, and a drain, the pair of switches being connected across a power supply which produces a maximum voltage, the switches being connected in series such that the drain of one of said switches is connected to the source of another of said switches, the gates of the switches being connected to control signals, the circuit further comprising:

a pair of inductors, the inductors being connected in series with each switch, the inductors being magnetically coupled to each other with opposing phases, and a pair of capacitors, each capacitor being connected in parallel with a series combination formed by one of said switches and one of said inductors, the capacitors having equal capacitances, wherein the control signals are applied to a gate circuit which includes one of the inductors, wherein each switch is never exposed to more than half the maximum voltage of the power supply, and wherein the control signals are applied to the gates of each switch simultaneously, and wherein the switches together comprise a single switching unit.

2. A high-voltage electronic switching circuit, the circuit comprising:

a) a first electronic switching means, the first switching means having a first terminal connected to a power supply, the first switching means having a second terminal connected to a first inductor, the power supply having a maximum voltage, b) a second electronic switching means, the second switching means having a first terminal connected to said first inductor and a second terminal connected to a second inductor, the second inductor being connected to the power supply, the first and second inductors being magnetically coupled with opposing phases, the first and second switching means being connected to control signals which are applied to the first and second switching means simultaneously each of the control signals being applied to a gate circuit which includes one of the inductors, the first and second switching means being connected in series, c) a first capacitor connected in parallel with a series combination comprising said first switching means and said first inductor, and d) a second capacitor connected in parallel with a series combination comprising said second switching means and said second inductor, wherein the first and second capacitors have substantially equal values of capacitance, wherein each switching means is never exposed to more than half the maximum voltage of the power supply, and wherein the first and second switching means together comprise a single switching unit.

3. A high-voltage electronic switching circuit comprising first and second switches connected in series across a power supply, each switch having a source, a gate, and a drain, wherein the drain of one of said switches is connected to the source of another of said switches, the power supply having a maximum voltage, the first and second switches being operated by control signals, the circuit further comprising:

a first inductor connected to the source of the first switch, a second inductor connected to the source of the second switch, the first inductor being connected to the drain of the second switch, the inductors being magnetically coupled with opposing phases, and a first capacitor connected in parallel with a series combination of said first switch and said first inductor, and a second capacitor connected in parallel with a series combination of said second switch and said second inductor, the capacitors having substantially equal values of capacitance, wherein a gate voltage is applied to each switch in a gate circuit, and wherein the gate circuit includes one of the inductors, wherein the switches together comprise a switching circuit in which each switch is never exposed to more than half the maximum voltage of the power supply, and wherein the control signals are applied to the gates of the first and second switches simultaneously and wherein the first and second switches together comprise a single switching unit.

4. A high-voltage switching circuit comprising:

a plurality of electronic switches connected in series, the switches being connected across a power supply, each of the switches having a source, a gate, and a drain, wherein the drain of one switch is connected to the source of another switch, wherein the gates of the switches are connected to control signals which are applied to the gates of the switches simultaneously, a plurality of inductors, each inductor being connected in series with each switch, the inductors being magnetically coupled to each other with opposing phases, and a plurality of capacitors, each capacitor being connected in parallel with a series combination comprising one of the switches and one of the inductors, wherein the control signals are applied to a gate circuit which includes one of the inductors, and wherein said plurality of electronic switches together comprises a single switching unit.

5. The circuit of claim 4, wherein the capacitors have substantially equal values.

6. The circuit of claim 4, wherein two of the capacitors have differing values.

* * * * *